United States Patent
Yamamoto

(10) Patent No.: US 9,244,222 B2
(45) Date of Patent: Jan. 26, 2016

(54) OPTICAL WAVEGUIDE DEVICE

(71) Applicant: SHINKO ELECTRIC INDUSTRIES CO., LTD., Nagano-shi (JP)

(72) Inventor: Kazunao Yamamoto, Nagano (JP)

(73) Assignee: SHINKO ELECTRIC INDUSTRIES CO., LTD., Nagano-shi (JP)

( * ) Notice: Subject to any disclaimer, the term of this patent is extended or adjusted under 35 U.S.C. 154(b) by 0 days.

(21) Appl. No.: 14/494,861

(22) Filed: Sep. 24, 2014

(65) Prior Publication Data
US 2015/0147023 A1  May 28, 2015

(30) Foreign Application Priority Data

Nov. 25, 2013  (JP) .................. 2013-242509

(51) Int. Cl.
*G02B 6/12* (2006.01)
*G02B 6/036* (2006.01)

(52) U.S. Cl.
CPC . *G02B 6/12* (2013.01); *G02B 6/036* (2013.01)

(58) Field of Classification Search
CPC ................... G02B 6/036; G02B 6/12
USPC ............................................. 385/14
See application file for complete search history.

(56) References Cited

U.S. PATENT DOCUMENTS

| | | | |
|---|---|---|---|
| 7,734,124 B2 * | 6/2010 | Yonekura et al. | 385/14 |
| 8,041,159 B2 * | 10/2011 | Yanagisawa | 385/14 |
| 8,737,781 B2 * | 5/2014 | Yamamoto et al. | 385/39 |
| 8,903,203 B2 * | 12/2014 | Yamamoto et al. | 385/14 |
| 2006/0110114 A1 * | 5/2006 | Yanagisawa et al. | 385/129 |
| 2007/0183718 A1 * | 8/2007 | Bae et al. | 385/47 |
| 2009/0074354 A1 * | 3/2009 | Yanagisawa | 385/14 |

FOREIGN PATENT DOCUMENTS

| | | |
|---|---|---|
| JP | 2003-215371 A1 | 7/2003 |
| JP | 2007-187871 A1 | 7/2007 |
| JP | 2009-69668 A1 | 4/2009 |
| JP | 2010-277060 A1 | 12/2010 |

\* cited by examiner

*Primary Examiner* — Akm Enayet Ullat
(74) *Attorney, Agent, or Firm* — Kratz, Quintos & Hanson, LLP

(57) ABSTRACT

An optical waveguide device includes a wiring substrate, a connection pad formed in the wiring substrate, an optical waveguide in which a first cladding layer, a core layer, and a second cladding layer are formed of the wiring substrate in this order, an opening portion formed in the second cladding layer in a region including the connection pad, a contact hole formed at least in the first cladding layer on the connection pad, and being communicated with the opening portion of the second cladding layer, an optical element, including a connection terminal, connected to the connection pad through the contact hole, and underfill resin filled in the opening portion of the second cladding layer and the contact hole, and sealing a lower side of the optical element, wherein a part of the opening portion or the second cladding layer is exposed from the optical element.

4 Claims, 15 Drawing Sheets

(plan view)

(plan view)

(plan view)

(plan view)

(plan view)

(plan view)

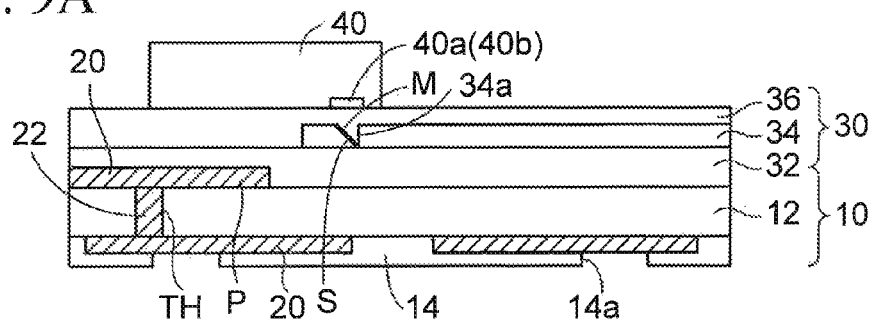
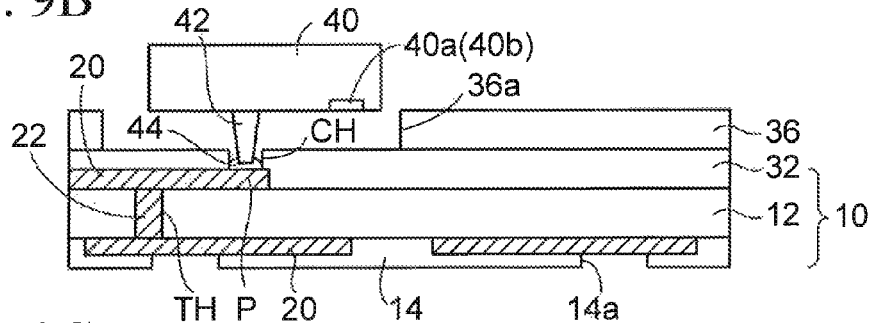
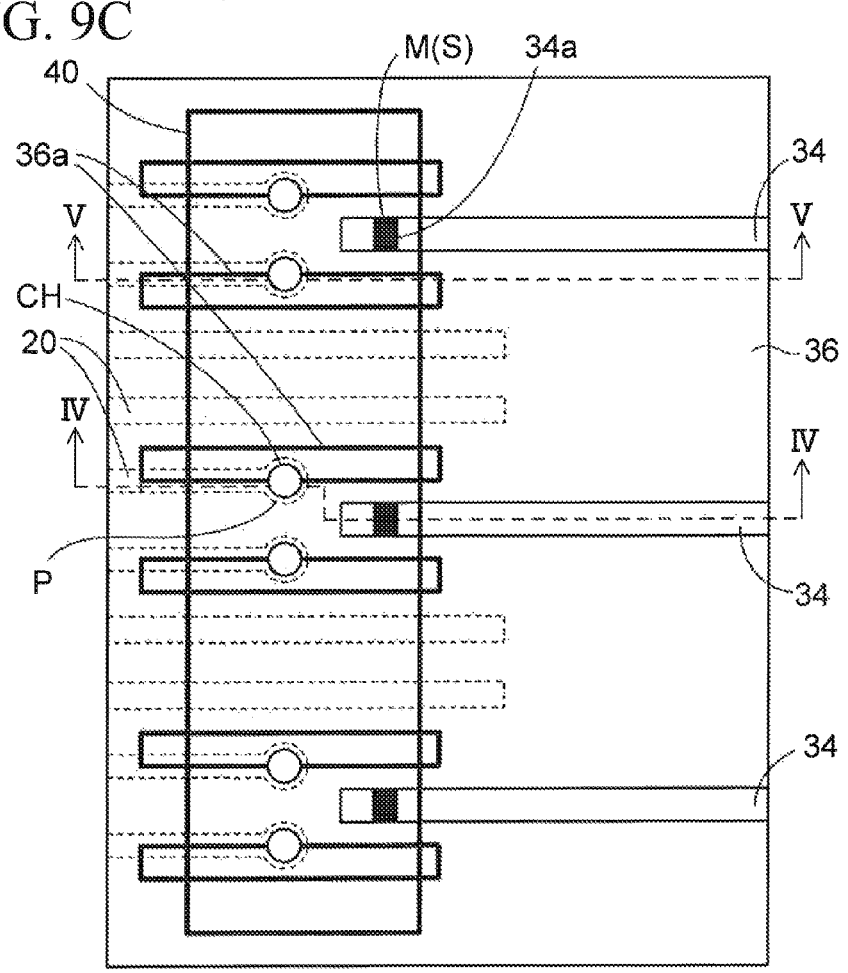

(plan view)

(plan view)

ately pointed out in the claims.

OPTICAL WAVEGUIDE DEVICE

CROSS-REFERENCE TO RELATED APPLICATIONS

This application is based upon and claims the benefit of priority of the prior Japanese Patent Application No. 2013-242503, filed on Nov. 25, 2013, the entire contents of which are incorporated herein by reference.

FIELD

This invention is related to an optical waveguide device and a method of manufacturing the same.

BACKGROUND ART

Recently, the development of backbone communication lines mainly based on optical fiber communication technologies is proceeding steadily and, in such a situation, the transmission speeds of electric signals in electrical devices and information terminals are becoming a bottleneck. Against such background, instead of the conventional electric circuit substrate in which all signal transmissions are made by using the electric signal, the optoelectronic composite substrate of the type that transmits high-speed parts by the light has been proposed, in order to compensate the limit of transmission speed of the electric signal.

In the optoelectronic composite substrate, a light signal is transmitted by an optical waveguide which is constructed such that a core layer is surrounded by cladding layers. Then, an optical element is mounted on the cladding layer of the optical waveguide such that the optical element is optically coupled to the light path conversion mirror.

A related art is disclosed in Japanese Laid-open Patent Publication No. 2003-215371, Japanese Laid-open Patent Publication No, 2007-187871, Japanese Laid-open Patent Publication No. 2009-69668, and Japanese Laid-open Patent Publication No. 2010-277060.

SUMMARY

As will be explained in the preliminary matter section below, there is an optical waveguide device having a structure in which the connection terminals of an optical element are connected to connection pads in contact holes of a wiring substrate in a state that the lower face of the optical element touches the upper face of an optical waveguide. In such an optical waveguide device, it is difficult to pour the underfill resin into the contact holes, thus there is a problem that the sufficient reliability cannot be ensured.

According to one aspect discussed herein, there is provided an optical waveguide device, including a wiring substrate, a connection pad formed in the wiring substrate, an optical waveguide in which a first cladding layer, a core layer, and a second cladding layer are formed on the wiring substrate in this order, an opening portion formed in the second cladding layer in a region including the connection, pad, a contact hole formed at least in the first cladding layer on the connection pad, and the contact hole being communicated with the opening portion of the second cladding layer, an optical element including a connection terminal connected to the connection pad in the contact hole, and underfill resin filled in the opening portion of the second cladding layer and the contact hole, and underfill resin, sealing a lower side of the optical element, wherein a part of the opening portion of the second cladding layer is exposed from the optical element.

Also, according to another aspect discussed herein, there is provided a method of manufacturing an optical waveguide device, including preparing a wiring substrate including a connection pad on an upper face of the wiring substrate, forming a first cladding layer on the wiring substrate, forming a core layer on the first cladding layer, forming a second, cladding layer on the first cladding layer and the core layer, the second cladding layer including an opening portion in a region including the connection pad, forming a contact hole at least in the first cladding layer, the contact hole being communicated with the opening portion of the second cladding layer and reaching the connection pad, connecting a connection terminal of an optical element, to the connection pad in the contact hole such that a part of the opening portion of the second cladding layer is exposed, and filling underfill resin into the contact hole through the opening portion of the second cladding layer, and sealing a lower side of the optical element.

Also, according to another aspect discussed herein, there is provided a method of manufacturing an optical waveguide device, including preparing a wiring substrate including a connection pad on an upper face of the wiring substrate, forming a first cladding layer on the wiring substrate, the first cladding layer including a contact hole on the connection pad, forming a core layer on the first cladding layer, forming a second cladding layer on the first cladding layer and the core layer, the second cladding layer including an opening portion being communicated with the contact hole, connecting a connection terminal of an optical element to the connection pad in the contact hole such that a part of the opening portion of the second cladding layer is exposed, and filling underfill resin into the contact hole through the opening portion of the second cladding layer, and sealing a lower side of the optical element.

The object and advantages of the invention will be realized and attained by means of the elements and combination particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 9A to 9C are cross-sectional views and a plan view depicting the method of manufacturing an optical waveguide device of the embodiment (Part 7).

DESCRIPTION OF EMBODIMENTS

Hereinbelow, embodiments will be explained with reference to the accompanying drawings.

Figure 1A:
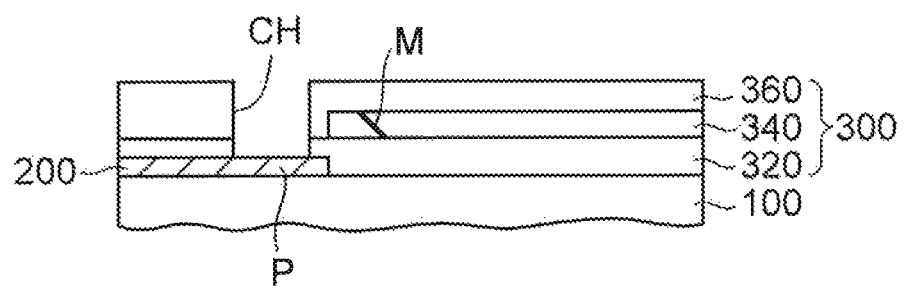
FIGS. 1A and 1B are cross-sectional views for explaining a problem in an optical waveguide device according to a preliminary matter.

Prior to the explanation of embodiments, the preliminary matter to be set forth as a basis will be explained hereunder. As depicted in FIG. 1A, in an optical waveguide device according to the preliminary matter, an optical waveguide 300 is arranged on a wiring substrate 100 including wiring layers 200. The optical waveguide 300 has a structure in which each core layer 340 is surrounded by a first cladding layer 320 and a second, cladding layer 360.

A light path conversion mirror M is provided in an end part of the core layer 340. Moreover, contact holes CH are formed in the first cladding layer 320 and the second cladding layer 360 and reach connection pads P of the wiring layers 200.

Figure 1B:
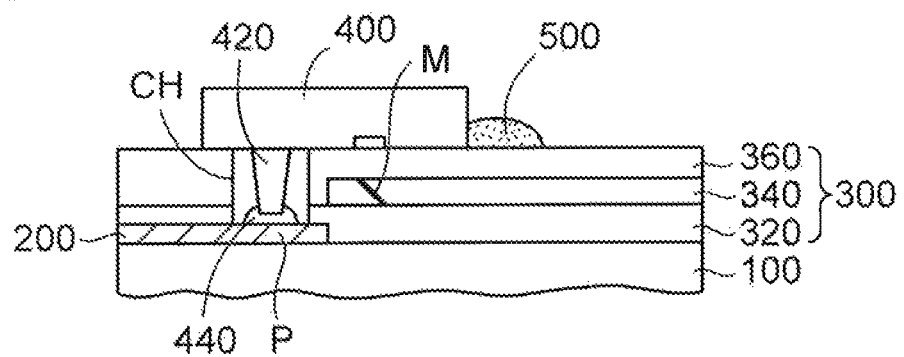

Then, as depicted in FIG. 1B, connection terminals 420 of an optical element 400 are arranged in the contact holes CH and connected to the connection pads P of the wiring layers 200 through solder 440. The optical element 400 is a light emitting element or a light receiving element, and the optical element 400 is optically coupled to the light path conversion mirrors M of the optical waveguide 300.

Here, the height of each connection terminal 420 of the optical element 400 is set lower than the depth of each contact hole CH. By this matter, the lower face of the optical element 400 touches the upper face of the optical waveguide 300, thereby a height position of the optical element 400 is decided, and most appropriate parallelism can be ensured.

In this state, since a space exists between each connection terminal 420 of the optical element 400 and the side wall of the contact hole CH, it is necessary to bury the space by the underfill resin. This is because, if the air remains inside the contact hole CH, the air expands in a subsequent heating process or the like, and the reliability of the electric connection of the optical element 400 decreases.

However, as depicted in FIG. 1B, since the lower face of the optical element 400 touches the upper face of the optical waveguide 300, a problem arises that the underfill resin 500 cannot be poured into the contact hole CH.

In the case that there is a small gap on the lower face side of the optical element 400, the underfill resin 500 can be filled therethrough, but doing so takes an extremely long process time and is not practical.

Embodiments to be explained below can solve the above-described problem.

Embodiment

FIG. 2A to FIG. 10B are views depicting a method of manufacturing an optical waveguide device of an embodiment. FIGS. 11A to 11C are views depicting an optical waveguide device of the embodiment. Hereinbelow, while explaining the method of manufacturing an optical waveguide device, a structure of the optical waveguide device will be explained.

Figure 2A:
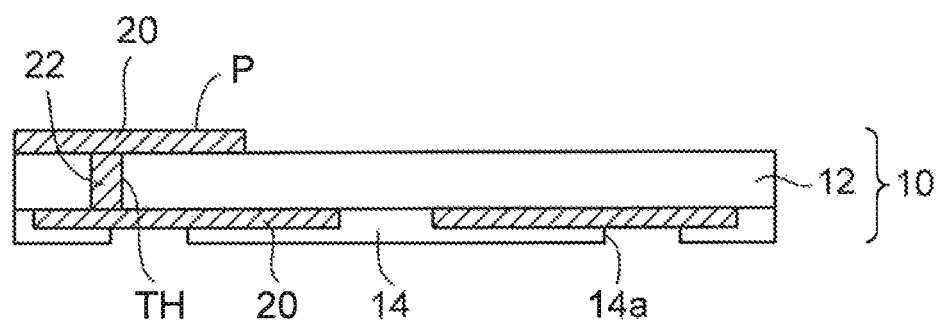
FIGS. 2A and 2B are cross-sectional views depicting a method of manufacturing an optical waveguide device of an embodiment (Part 1).

In the method of manufacturing an optical waveguide device of the embodiment, first, a wiring substrate 10 as depicted in FIG. 2A is prepared. In the wiring substrate 10, wiring layers 20 are formed on both faces of a substrate 12. Through-holes TH penetrating in the thickness direction are provided in the substrate 12, and penetrating electrodes 22 are filled in the through-holes TH. The wiring layers 20 on both face sides are connected each other through the penetrating electrodes 22. The wiring layer 20 on the upper face of the substrate 12 includes a connection pad P at one end thereof.

Also, a solder resist layer 14 is formed on the lower face of the substrate 12, and the solder resist layer 14 in which opening portions 14a are provided on connection parts of the wiring layers 20.

Note that, the wiring layers 20 on both face sides may be connected each other by through-hole plating layers formed on the sidewalls of the through-holes TH, and resin may be filled in the remaining hole parts of the through-holes TH.

Also, the substrate 12 may be a rigid substrate or a flexible substrate. In the case of employing a rigid substrate, the substrate 12 is formed, for example, of glass epoxy resin or the like. Alternatively, in the case of employing a flexible substrate, the substrate 12 is formed, for example, of a polyimide film or the like. Moreover, on both face sides of the substrate 12, the number of the lamination of wiring layers 20 can be set to any suitable number.

The through-holes TH in the wiring substrate 10 are formed by a drill, a laser, or the like, and the wiring layers 20 on both face sides and the penetrating electrodes 22 are formed by using the photolithography and plating techniques or the like.

Figure 2B:
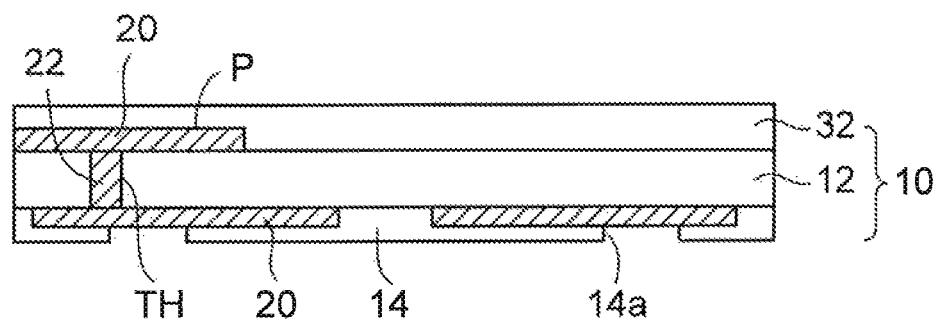

Then, as depicted in FIG. 2B, a photosensitive resin layer (not depicted) for obtaining a first cladding layer is formed in an optical waveguide forming region on the wiring substrate 10, and the exposure and the development are performed on the basis of the photolithography. Thereafter, the photosensitive resin layer is cured by a heating process at about 100° C. to 140° C. By this matter, a first cladding layer 32 is formed in the optical waveguide forming region on the wiring substrate 10. The thickness of the first cladding layer 32 is about 10 μm to 30 μm, for example.

As the photosensitive resin layer, UV curable epoxy resin or the like is preferably used. As the method of forming the photosensitive resin layer, a semi-cured (B-stage) photosensitive resin sheet may be attached, or liquid photosensitive resin may be coated.

Similar resin is preferably used in later-described steps of forming a core layer and a second cladding layer.

Figure 3A:
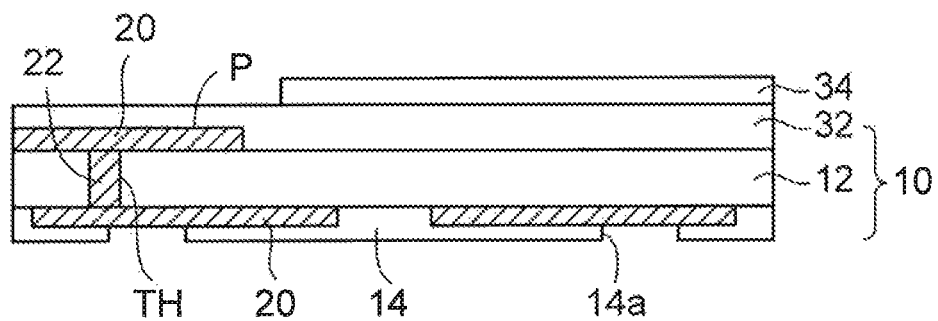
FIGS. 3A and 3B are a cross-sectional view and a plan view depicting the method of manufacturing an optical waveguide device of the embodiment (Part 2).

Subsequently, as depicted in FIG. 3A, a photosensitive resin layer (not depicted) for obtaining the core layer is formed on the first cladding layer 32. Further, the exposure and the development are performed on the basis of the photolithography, and then the photosensitive resin layer is cured by a heating process at about 100° C. to 140° C. By this matter, a core layer 34 is formed on the first cladding layer 32.

Figure 3B:
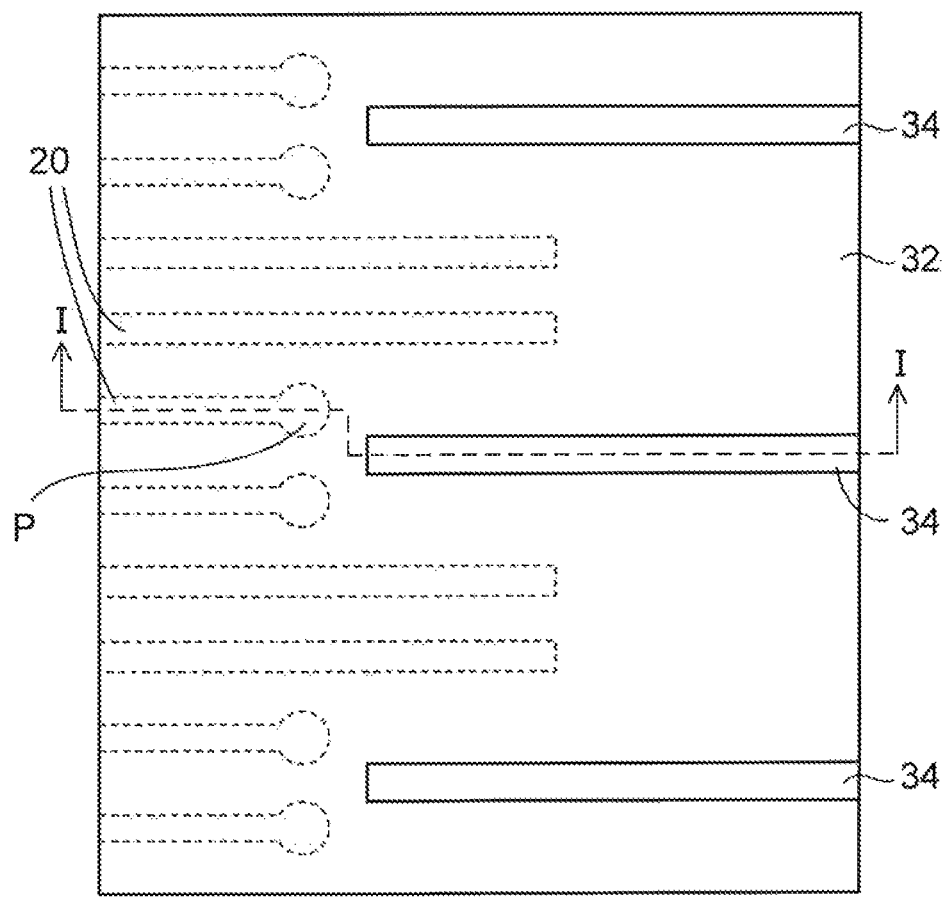

In this step, as depicted in a plan view in FIG. 3B, the core layers 34 are formed side by side on the first cladding layer 32 as a plurality of belt-shaped patterns. The width of each core layer 34 is set to about 30 μm to 40 μm, and the thickness of each core layer 34 is set to about 30 μm to 80 μm.

FIG. 3A corresponds to a cross section taken along broken line I-I in the plan view in FIG. 3B. The same applies to FIG. 4A to FIG. 5B to be mentioned later.

Figure 4A:
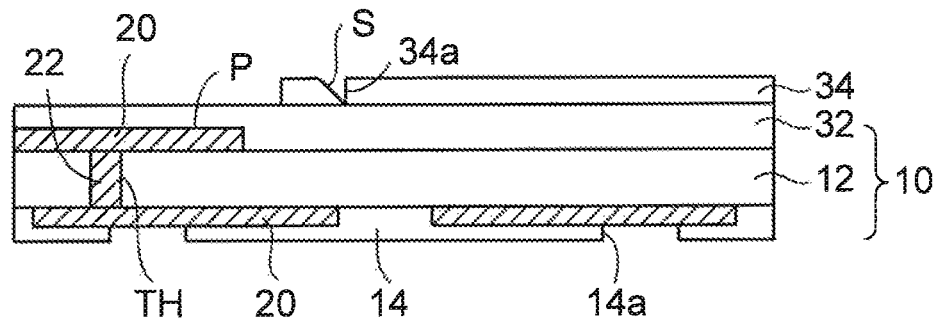
FIGS. 4A and 4B are a cross-sectional view and a plan view depicting the method of manufacturing an optical waveguide device of the embodiment (Part 3).
Figure 4B:
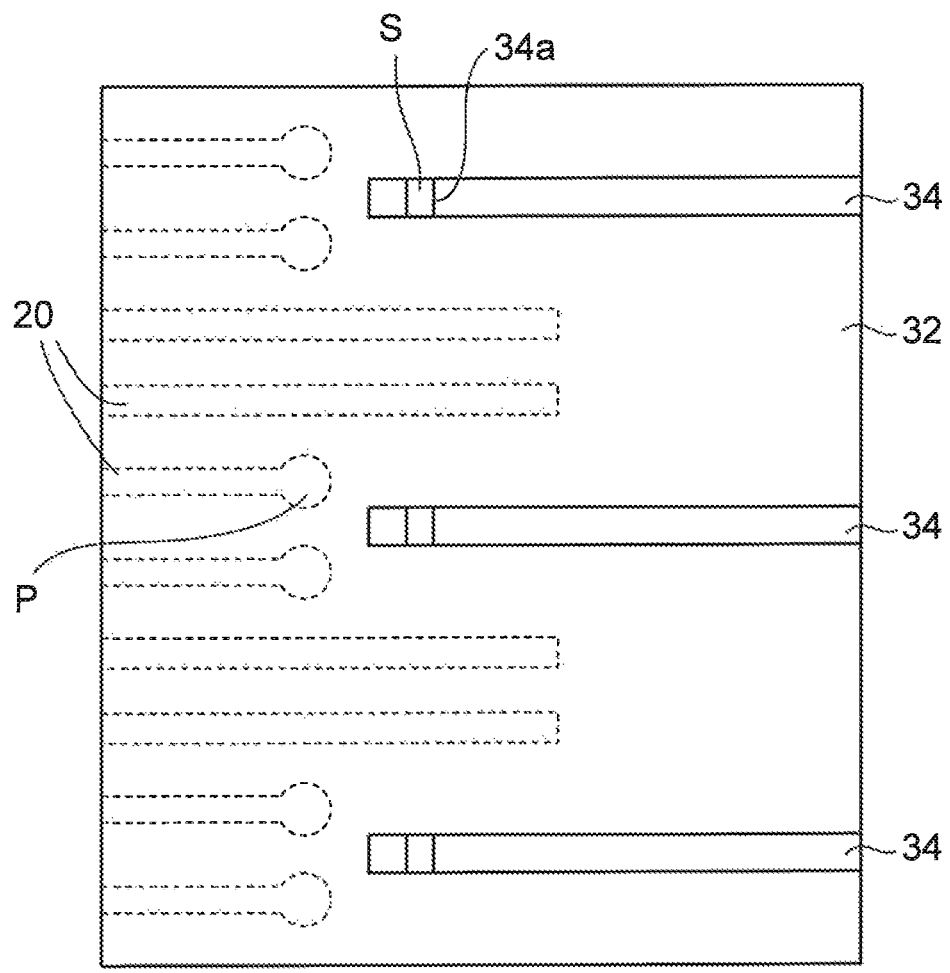

Thereafter, as depicted in FIGS. 4A and 4B, parts of on both end sides of each core layer 34 where light path conversion mirrors are to be arranged are cut in the thickness direction by the rotary blade of a cutting device. FIGS. 4A and 4B depict partially the region of the core layer 34 on one end side.

By this matter, Y-shaped dividing portions 34a each having a light path conversion inclined face S for converting a light path by 90° are formed. The light path conversion inclined face S is formed to incline preferably at 45° to the surface of the wiring substrate 10. Besides the cutting, by using a laser or the like, the dividing portion. 34a having the light path conversion inclined face S can be formed.

Furthermore, the dividing portion 34a may be formed so as to divide the core layer 34, and may be formed up to the halfway position in the thickness direction of the first cladding layer 32.

Figure 5A:
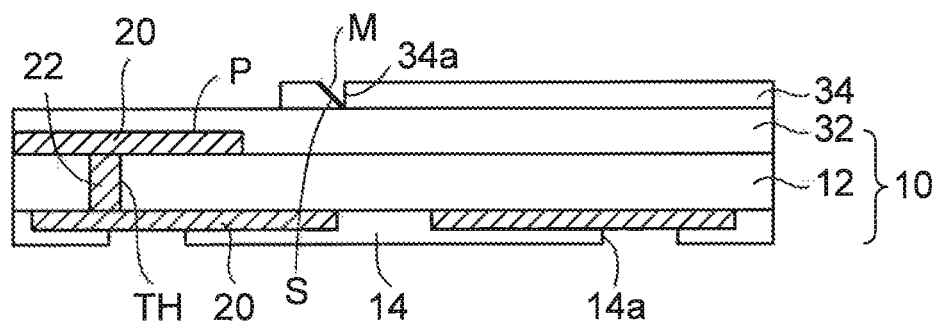
FIGS. 5A and 5B are a cross-sectional view and a plan view depicting the method of manufacturing an optical waveguide device of the embodiment (Part 4).
Figure 5B:
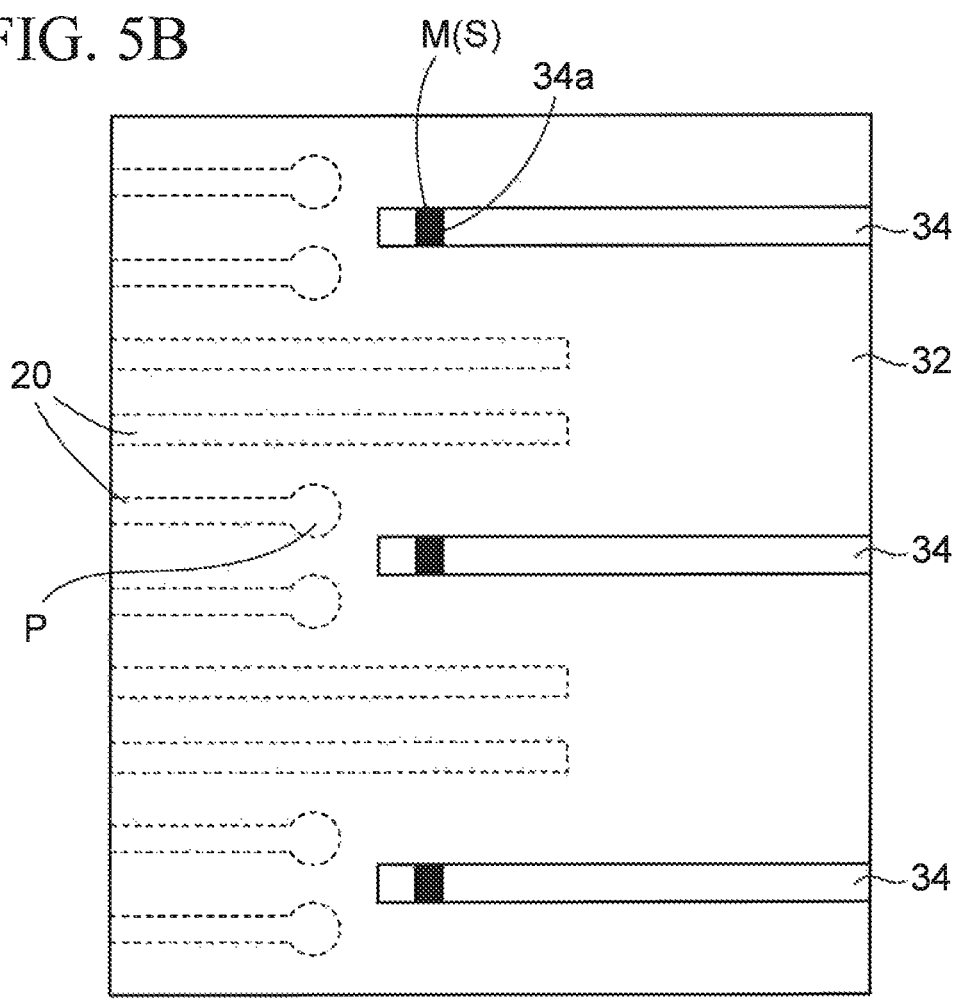

Thereafter, as depicted in FIGS. 5A and 5B, a metal layer having a light reflective property is partially formed on the light path conversion inclined face S of each dividing portion 34a of the core layer 34 by mask vapor deposition or the like, thereby a light path conversion mirror M is obtained. As the metal having the light reflective property, gold, aluminum, and the like are available.

Figure 6A:
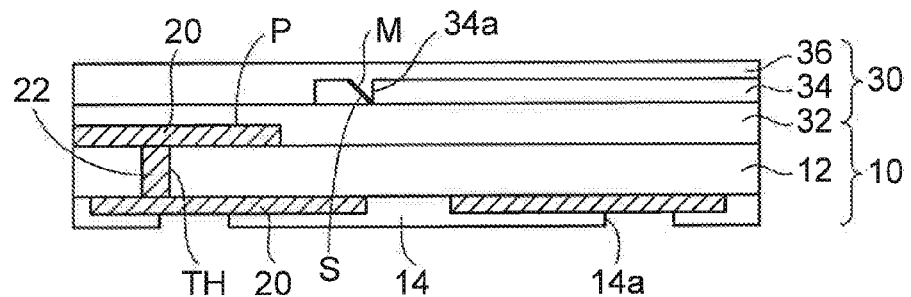
FIGS. 6A to 6C are cross-sectional views and a plan view depicting the method, of manufacturing an optical waveguide device of the embodiment (Part 5).
Figure 6B:
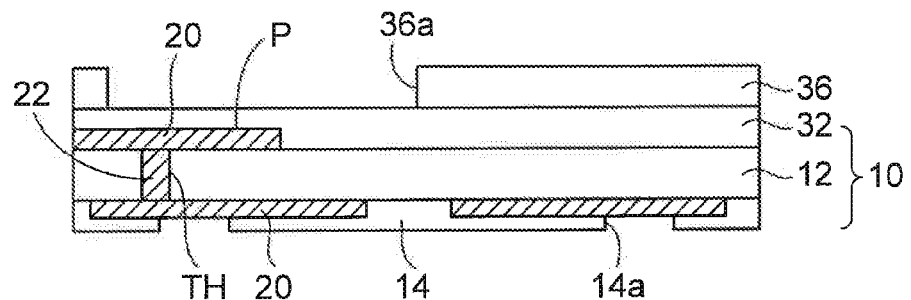

Next, a method, of patterning a second cladding layer 36 on the first cladding layer 32 and the core layer 34 will be explained with reference to FIGS. 6A to 6C. FIG. 6A corresponds to a cross section taken along broken line II-II in a plan view in FIG. 6C. FIG. 6B corresponds to a cross section taken along broken line III-III in the plan view in FIG. 6C.

The same applies to FIG. 7 to be mentioned later. Also, the plan view in FIG. 6C is illustrated in a perspective view, and the same applies to the subsequent plan views.

As depicted in FIG. 6A, a photosensitive resin layer (not depicted) for obtaining the second cladding layer is formed on the first cladding layer 32 and the core layer 34. Further, the exposure and the development are performed on the basis of the photolithography, and then the photosensitive resin layer is cured by a heating process at about 100° C. to 140° C. By this matter, the second cladding layer 36 is formed on the first cladding layer 32, the second cladding layer 36 covering the core layer 34.

Figure 6C:
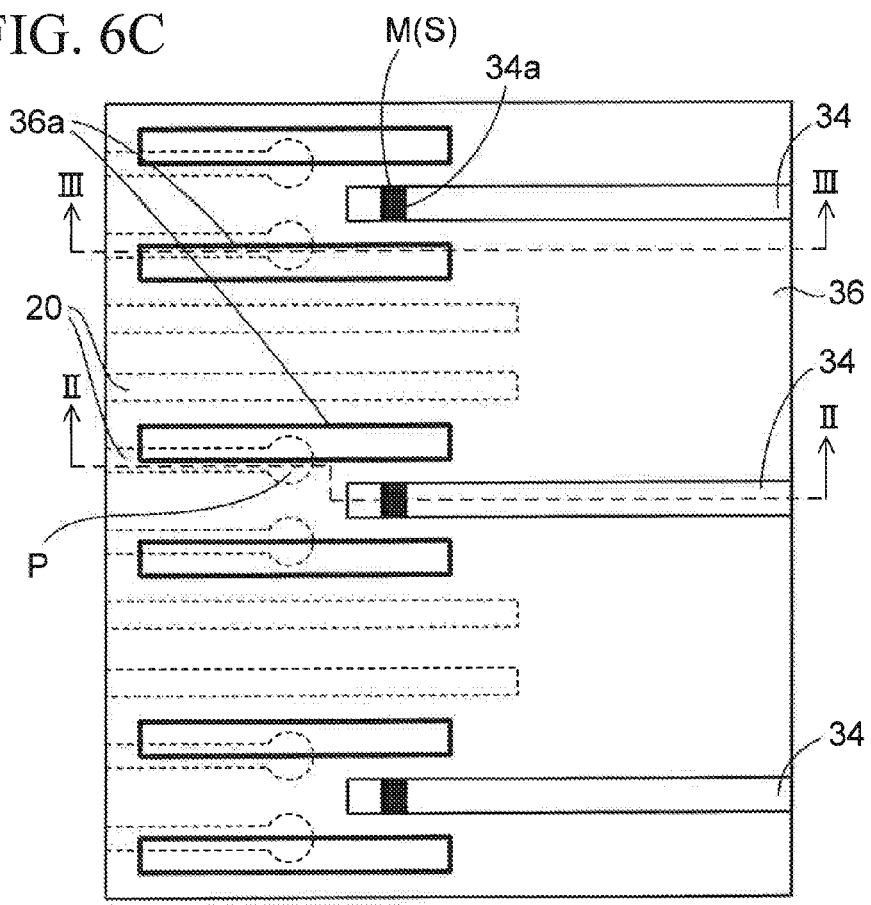

In this step, as depicted in FIG. 6C, the second cladding layer 36 is patterned such that opening portions 36a are arranged in regions including the connection pads P of the wiring layers 20 of the wiring substrate 10. Each opening portion 36a of the second cladding layer 36 only needs to be arranged in a region including at least a part of the connection pad P.

As will be described later, the opening portions 36a of the second cladding layer 36 function as flow paths for pouring the underfill resin into contact holes, after the connection terminals of an optical element are connected to the connection pads P inside the contact holes.

For this reason, the opening portions 36a of the second cladding layer 36 are arranged so as to be communicated with the contact holes which are to be arranged on the connection pads P.

Moreover, the length of the opening portion 36a of the second cladding layer 36 is set longer than the width of the optical element to be mounted. Thus, when the optical element is mounted, a part of the opening portion 36a of the second cladding layer 36 is exposed outside the optical element.

In the example of the plan view in FIG. 6C, the diameter of the connection pad P of the wiring layer 20 is set larger than the width of the opening portion 36a of the second cladding layer 36. For example, the diameter of the connection pad P of the wiring layer 20 is 60 μm to 80 μm, and the width of the opening portion 36a of the second cladding layer 36 is about 30 μm to 40 μm.

For this reason, in the example of the plan view in FIG. 6C, the opening portion 36a of the second cladding layer 36 is arranged on the connection pad P such that the connection pad P protrudes from a sidewall of the opening portion 36a toward an outside.

Alternatively, the diameter of the connection pad P may be made smaller than the width of the opening portion 36a of the second cladding layer 36, thereby the whole of the connection pad P may be arranged within the opening portion 36a of the second cladding layer 36.

Figure 7A:
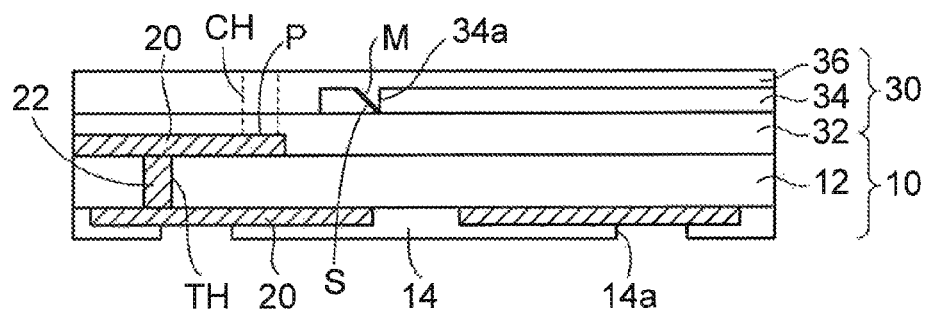
FIGS. 7A to 7C are cross-sectional views and a plan view depicting the method, of manufacturing an optical waveguide device of the embodiment (Part 6).
Figure 7B:
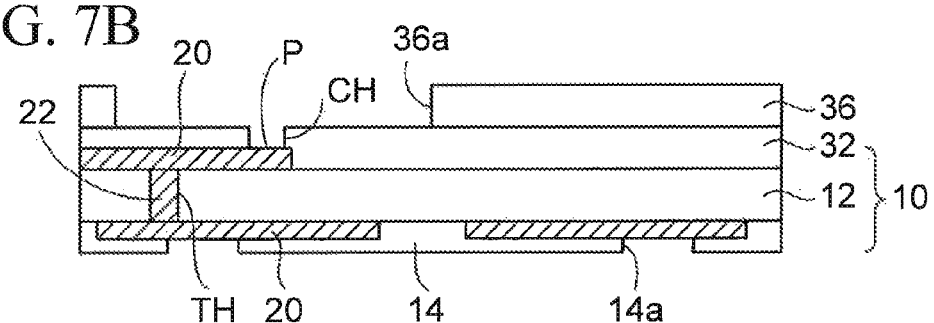
Figure 7C:
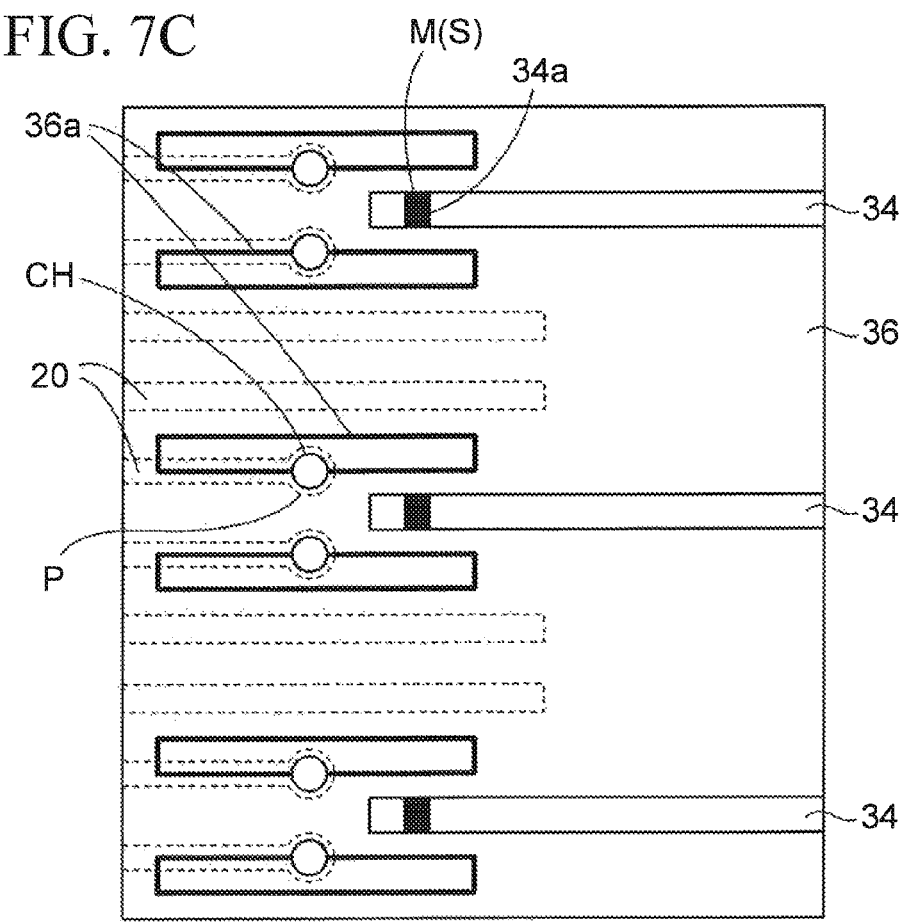

Thereafter, as depicted in FIGS. 7A to 7C, the second cladding layer 36 and the first cladding layer 32 are processed by a laser to form contact holes CH reaching the connection pads P of the wiring layers 20 of the wiring substrate 10.

As depicted in FIG. 7C, the contact hole CH is arranged on the connection pad P in a state that the contact hole C protrudes from the sidewall of the opening portion 36a of the second cladding layer 36 toward the outside. The contact hole CH is formed so as to be communicated with the opening portion 36a of the second cladding layer 36.

By this matter, as depicted in FIG. 7A, an optical waveguide 30 in which the first cladding layer 32, the core layers 34 and the second cladding layer 36 are formed in this order from the bottom is obtained on the wiring substrate 10.

Note that, in the manufacturing method in FIG. 6A to FIG. 7C mentioned above, after the opening portions 36a are formed in the second cladding layer 36 on the basis of the photolithography, end then the second cladding layer 36 and the first cladding layer 32 are opened by the laser to form the contact holes CH.

Figure 8A:
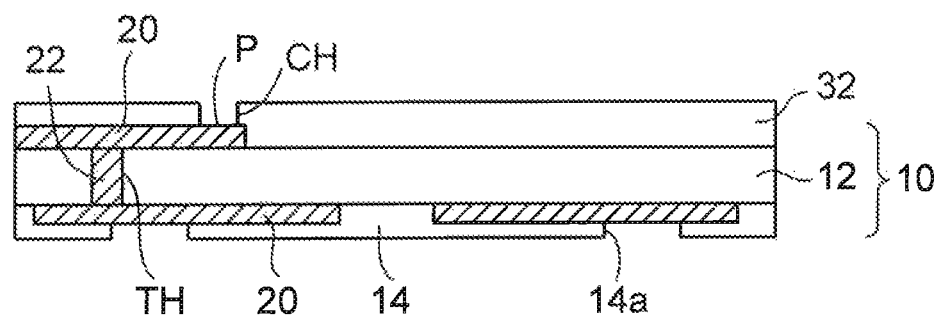
FIGS. 8A and 8B are cross-sectional views depicting another method for obtaining the structure in FIG. 7B.

Besides this manufacturing method, as depicted in FIG. 8A, in the step in FIG. 2B mentioned above, the contact holes CH may be formed in the first cladding layer 32 at the same time by the photolithography. Alternatively, after the step in FIG. 2B mentioned above, the contact holes CH may be formed in the first cladding layer 32 by the laser.

Figure 8B:
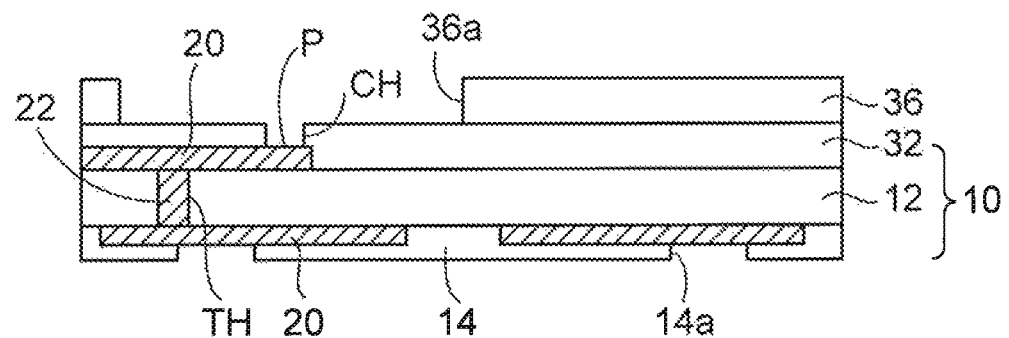

Thereafter, as depicted in FIG. 8B, in the step in FIG. 6B mentioned above, the opening portions 36a are formed in the second cladding layer 36 so as to be communicated with the contact holes CH. By this matter, an optical waveguide 30 having the same structure as that in FIGS. 7A and 7B can be obtained.

In this method, the opening portion 36a of the second cladding layer 36 on the region of the contact hole CH is formed to protrude toward the outside with a semicircle shape such that the opening portion 36a constitutes the sidewall of the contact hole CH.

Next, a method of mounting an optical element on the structure in FIGS. 7A to 7C mentioned above will be explained with reference to FIGS. 9A to 9C. Similarly to FIGS. 6A to 6C mentioned above, FIG. 9A corresponds to a cross section taken along broken line IV-IV in a plan view in FIG. 9C, and FIG. 9B corresponds to a cross section taken along broken line V-V in the plan view in FIG. 9C. The same applies to FIGS. 10A to 10C and FIGS. 11A to 11C to be mentioned later. Also, FIG. 9C is illustrated in a perspective view.

As depicted in FIG. 9B, an optical element 40 including connection terminals 42 on a lower face thereof is prepared. The connection terminals 42 are formed of a bump electrode such as a gold bump. Then, the connection terminals 42 of the optical element 40 are connected to the connection pads P of the wiring layers 20 in the contact holes CH through solder 44.

In the case that the optical element 40 is a light emitting element, it includes light, emitting portions 40a in the lower face, and the light emitting portions 40a are optically coupled to the light path conversion mirrors M of the core layers 34. Alternatively, in the case that the optical element 40 is a light receiving element, it includes light receiving portions 40b in the lower face, and the light receiving portions 40b are optically coupled to the light path conversion mirrors M of the core layers 34.

Here, referring to the plan view in FIG. 9C, as mentioned above, the length of the opening portions 36a of the second cladding layer 36, which are communicated with the contact holes CH, is set longer than the width of the optical element 40. For this reason, when the optical element 40 is mounted, it is in a state that parts of the both end sides of each opening portion 36a of the second cladding layer 36 are exposed outside the optical element 40 respectively.

Also, the height of the connection terminal 42 of the optical element 40 is set lower than the height from the surface of the connection pad P located at the bottom of the contact hole CH to the upper end of the opening portion 36a of the second cladding layer 36. For this reason, as depicted, in FIG. 9A, the lower face of the optical element 40 touches the upper face of the second cladding layer 36, thereby the height position of the optical element 40 is decided, and most appropriate parallelism can be ensured.

In this way, in the state that the lower face of the optical element 40 touches the upper face of the second cladding layer 36, the opening portions 36a of the second cladding layer 36, which are used as the flow paths of the underfill resin, are exposed outside the optical element 40 and are arranged.

Figure 10A:
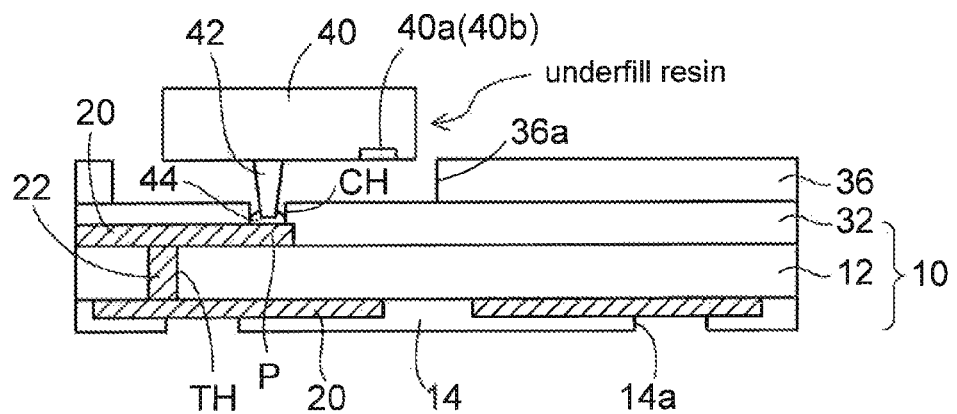
FIGS. 10A and 10B are a cross-sectional view and a plan view depicting the method of manufacturing an optical waveguide device of the embodiment (Part 8).
Figure 10B:
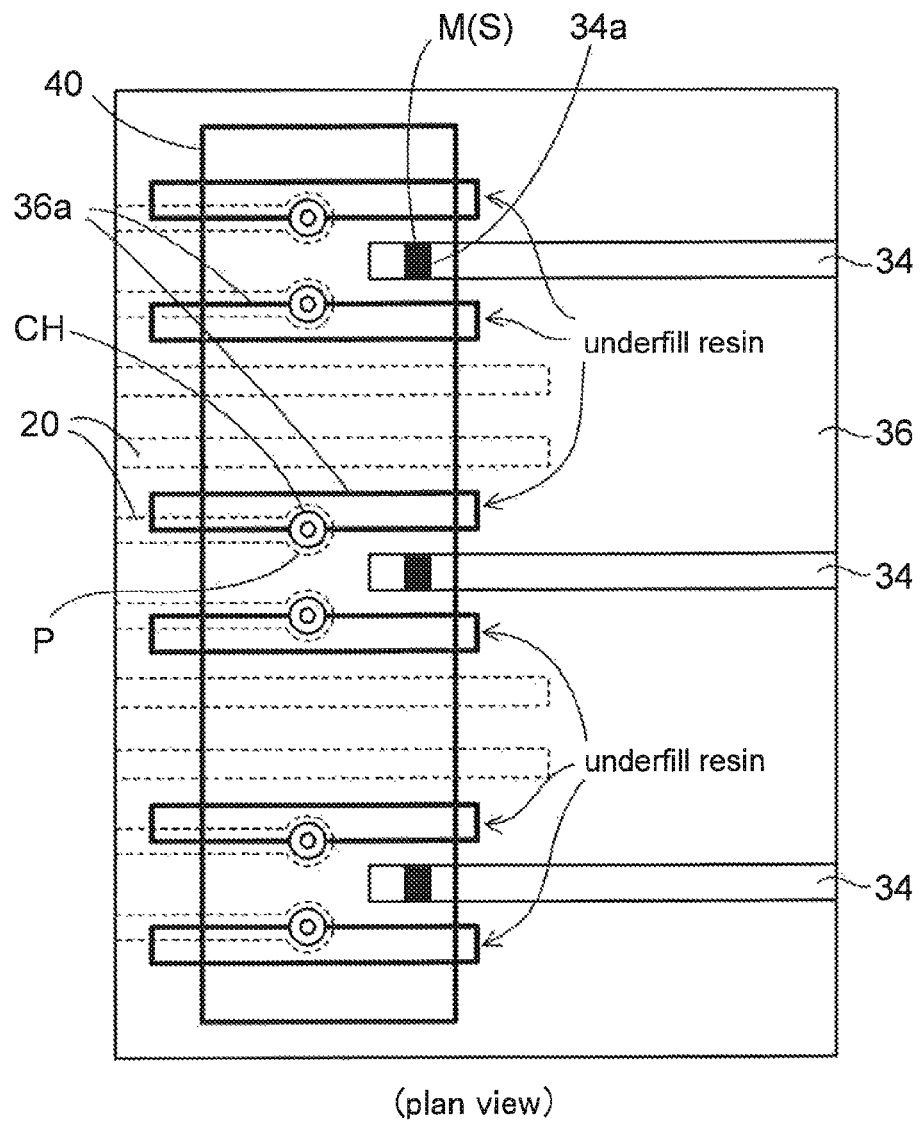
Figure 11A:
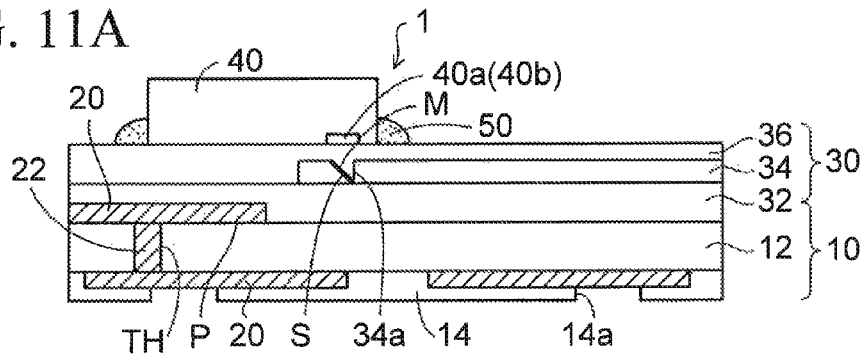
FIGS. 11A to 11C are cross-sectional views and a plan view depicting an optical waveguide device of the embodiment.
Figure 11B:
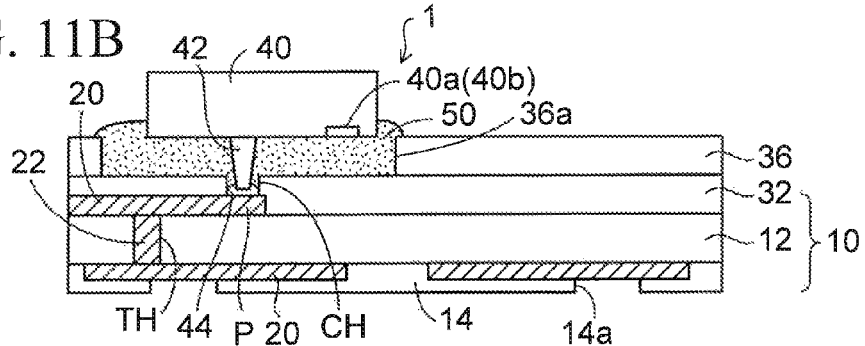
Figure 11C:
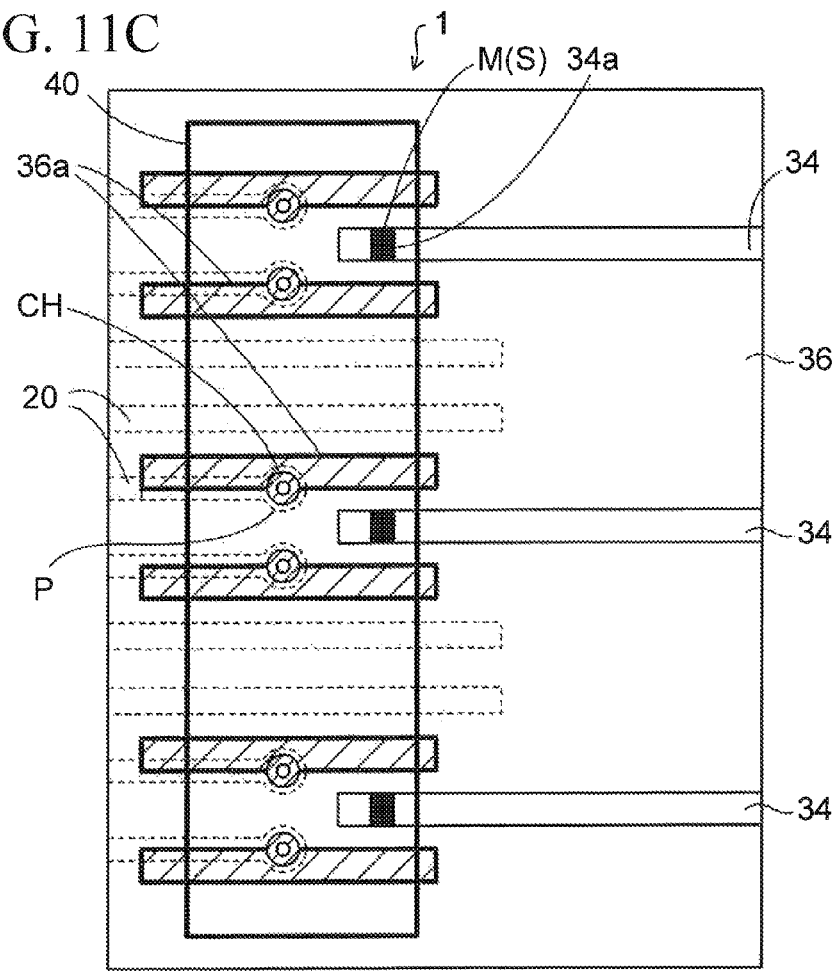

Thereafter, as depicted in FIGS. 10A and 10B, liquid underfill resin is coated to the vicinity region of the side faces of the optical element 40 in a lump by a dispenser or the like. In this step, the underfill resin infiltrates by the capillary action up to the inside of the contact holes CH which are communicated with the opening portions 36a, in a state that the opening portions 36a of the second cladding layer 36 function as the flow path.

By this matter, as depicted in FIGS. 11B and 11C, the underfill resin 50 is filled in the opening portions 36a of the second cladding layer 36 under the optical element 40 and in the gaps between the side faces of the contact holes CH which are communicated with the opening portions 36a and the connection terminals 42 of the optical element 40.

In the plan view in FIG. 11C, the underfill resin 50 is filled in the regions hatched with oblique lines. Moreover, as depicted in FIG. 11A, in the parts that the optical element 40 touches the second cladding layer 36, it is in a state that the underfill resin 50 remains on both outer sides of the optical element 40.

In this way, in this embodiment, even when the optical element 40 is mounted such that the lower face of the optical element 40 touches the upper face of the second cladding layer 36, the parts of the opening portions 36a of the second cladding layer 36, which are communicated with the contact holes CH, are exposed outside the optical element 40. For this reason, the underfill resin 50 can be easily filled from the opening portions 36a of the second cladding layer 36 into the contact holes CH under the optical element 40.

By the above steps, as depicted in FIGS. 11A to 11C, an optical waveguide device 1 of the embodiment is obtained.

As depicted in FIGS. 11A and 11B, the optical waveguide device 1 of the embodiment includes the wiring substrate 10 explained in FIG. 2A mentioned above. The optical waveguide 30 is formed on the wiring substrate 10.

The optical waveguide 30 is formed from the first cladding layer 32, the core layers 34 formed on first cladding layer 32, and the second cladding layer 36 covering the core layers 34, and has a structure in which the core layers 34 are surrounded by the first and second cladding layers 32, 36. The refractive index of the core layer 34 is set higher than the refractive indexes of the first cladding layer 32 and the second cladding layer 36.

As depicted in FIGS. 11B and 11C, the contact holes CH are formed in the second cladding layer 36 and the first cladding layer 32 and reach the connection pads F of the wiring layers 20. Further, the opening portions 36a are formed in the second cladding layer 36 in the regions including the connection pads P, and are communicated with the contact holes CH.

The opening portions 36a of the second cladding layer 36 are communicated with the contact holes CH respectively, and are arranged to be separated each other, and are formed to extend with a long and narrow shape in the same direction as the extending direction of the core layers 34.

Then, the connection terminals 42 of the optical element 40 are arranged in the contact holes CH, and are connected to the connection pads P of the wiring layers 20 through the solder 44.

The length of the opening portion 36a of the second cladding layer 36 is set longer than the width of the optical element 40, and the parts or the opening portions 36a of the second cladding layer 36 protrude and are exposed to both outer sides of the optical element 40.

Moreover, the height of the connection terminal 42 of the optical element 40 is set lower than the height from the surface of the connection pad P located at the bottom of the contact hole CH to the upper end of the opening portion 36a of the second cladding layer 36. For this reason, the lower face of the optical element 40 touches the upper face of the second cladding layer 36, thereby the height position of the optical element 40 is decided, and most appropriate parallelism can be ensured.

Further, as depicted in FIGS. 11B and 11C, the underfill resin 50 for sealing the lower side of the optical element 40 is filled in the opening portions 36a of the second cladding layer 36 and in the gaps between the sidewalls of the contact holes CH and the connection terminals 42 of the optical element 40.

A light emitting element or a light receiving element is used as the optical element 40. A vertical cavity surface emitting laser (VCSEL) is preferably used as the light emitting element, and a photodiode is preferably used as the light receiving element.

Moreover, as depicted in FIG. 11A, the light path conversion mirrors M formed of the metal having the light reflective property are arranged in the end parts of the core layers 34 of the optical waveguide 30. Then, the optical element 40 is optically coupled to the light path conversion mirrors M of the optical waveguide 30.

In the case that the optical element 40 is a light emitting element, the light emitting portions 40a arranged in the lower face of the light emitting element are optically coupled to the light path conversion mirrors M. Alternatively, in the case that the optical element 40 is a light receiving element, the light receiving portions 40b arranged in the lower face of the light receiving element are optically coupled to the light path conversion mirrors M.

As described above, in the optical waveguide device 1 of the embodiment, the underfill resin 50 is filled into the contact holes CH, in a state that the opening portions 36a of the second, cladding layer 36 arranged outside the optical, element 40 function as the flow paths.

Since each contact hole CH is communicated with the opening portions 36a of the second cladding layer 36, the underfill resin 50 can be filled reliably into all the contact holes CH. By this matter, even if a heating process is performed later, the air never expands inside the contact holes CH. By this matter, it is possible to ensure the reliability of the electric connection between the optical element 40 and the connection pad P of the wiring substrate 10.

Moreover, when the optical element 40 is mounted, the lower face of the optical element 40 is touched to the upper face of the optical waveguide 30. Therefore, the height level and the parallelism can be optimized easily, and the optical performance can be improved.

Figure 12:
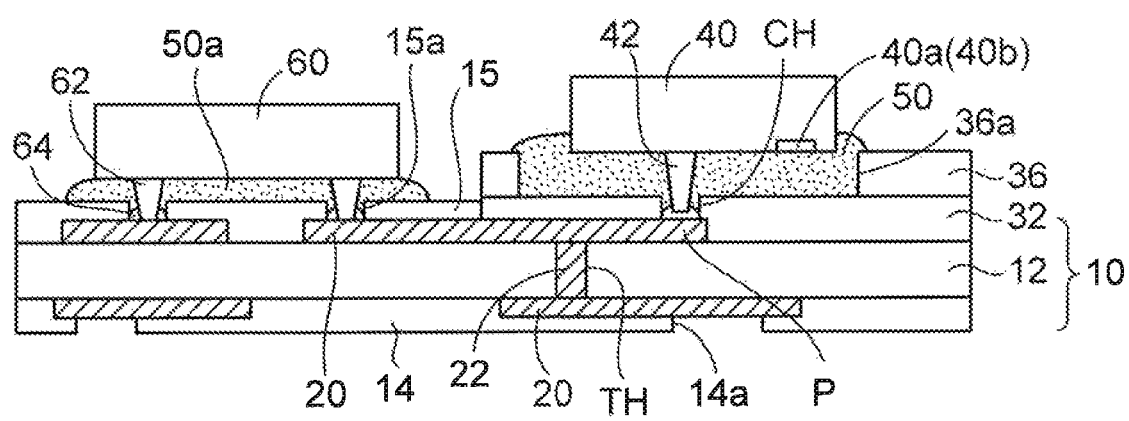
FIG. 12 is a cross-sectional view depicting a state that a control element is connected to an optical element in FIGS. 11A to 11C.

FIG. 12 depicts a state that a control element 60 is connected to the optical element 40 in FIG. 11A. As depicted in FIG. 12, a solder resist layer 15 is formed on the wiring substrate 10 at a lateral side of the optical element 40, the solder resist layer 15 in which opening portions 15a are provided on the connection parts of the wiring layers 20.

Then, connection terminals 62 of the control element 60 are connected to the connection parts of the wiring layers 20 through solder 64. Further, underfill resin 50a is filled under the control element 60.

In this way, the optical element 40 is electrically connected to the control element 60 through the wiring layers 20 of the wiring substrate 10.

Next, light propagation in the optical waveguide device 1 of the embodiment will be explained with reference to FIGS. 11A and 11B and FIG. 12. In FIG. 12, in the case that the optical element 40 is a light emitting element, the control element 60 is arranged as a driver element. Then, electric signals outputted from the driver element are supplied to the light emitting element, and light is emitted downward from the light emitting face of the light emitting element.

The light emitted from the light emitting element is transmitted through the second cladding layer 36 and reaches the light path conversion mirrors M (FIG. 11A). Further, the light is reflected by the light path conversion mirrors M, thereby the light paths are converted by 90°, and the light enters the core layers 34.

Thereafter, the light entered in the core layers 34 propagates inside the core layers 34 by repeating total internal reflection, and the light paths are converted by 90° C. at the light path conversion mirrors M on the other end side. And then the light enters the light receiving portions of a light receiving element.

On the other hand, in the case that the optical element 40 is a light receiving element, the control element 60 is arranged as an amplifier element. In this case, the light propagates in the directions reverse to the light path described above, and the light enters the light receiving face of the light receiving element. Further, the optical signals are converted into electric signals by the light receiving element, and the electric signals are supplied to the amplifier element.

Other Embodiments

Figure 13:
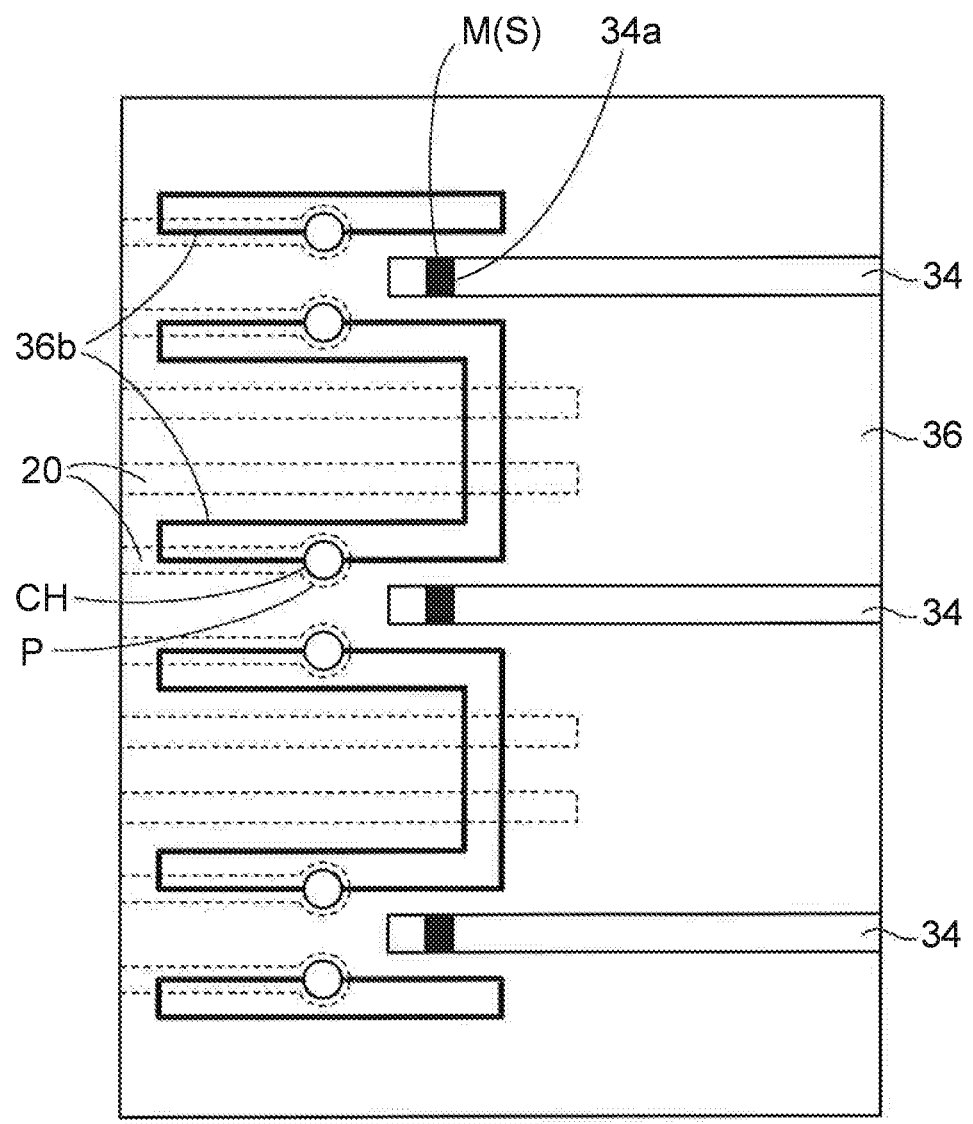
FIG. 13 is a plan view depicting a first modification of opening portions of a second cladding layer according to the optical waveguide device of the embodiment.
Figure 14:
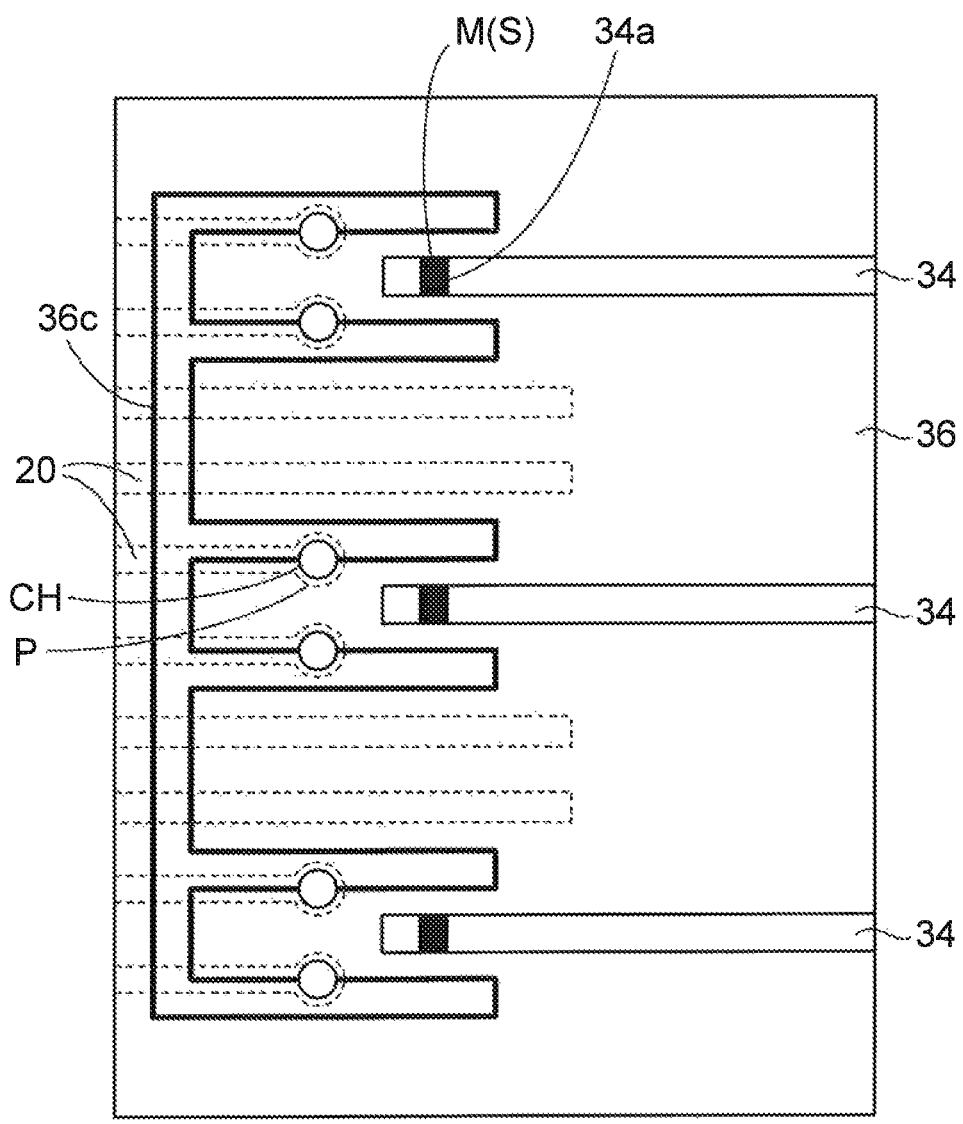
FIG. 14 is a plan view depicting a second modification, of the opening portions of the second cladding layer according to the optical waveguide device of the embodiment.
Figure 15:
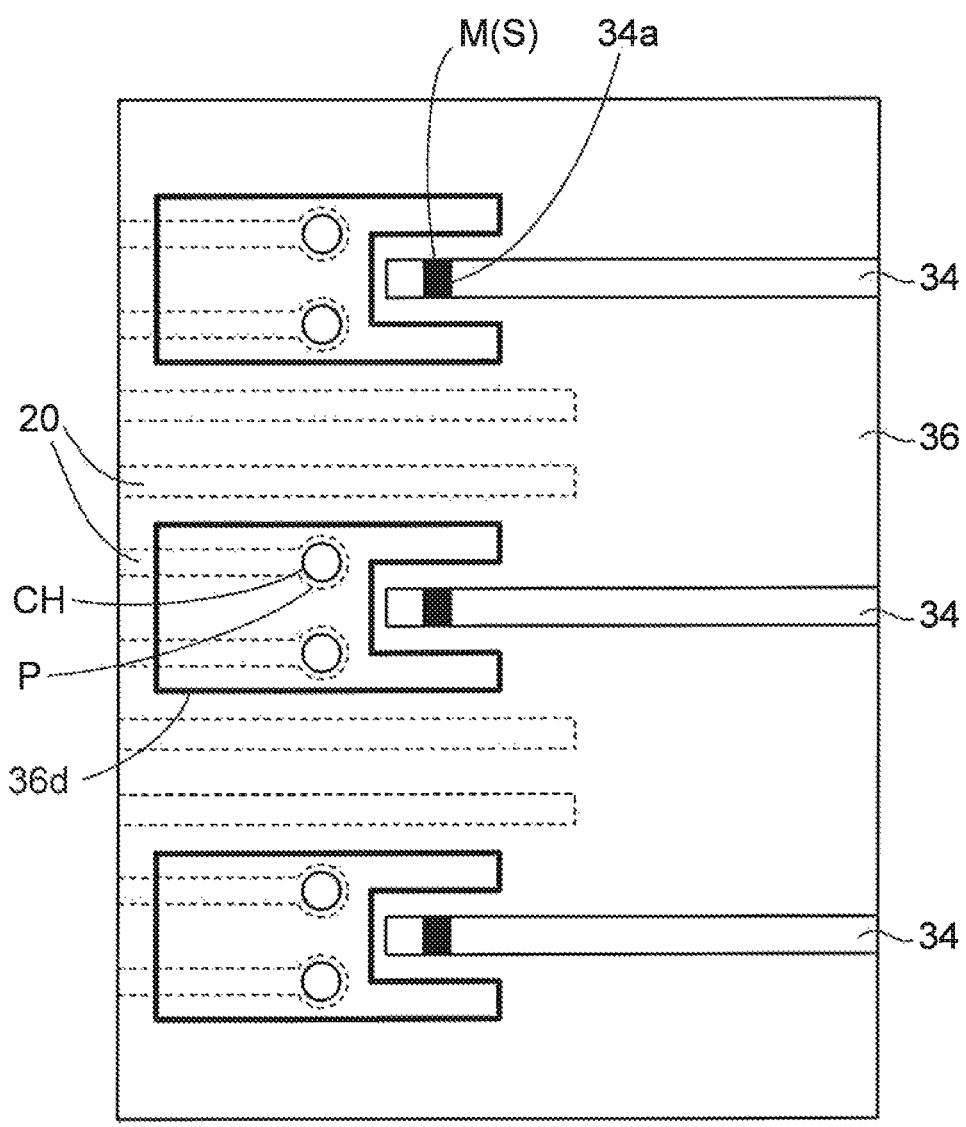
FIG. 15 is a plan view depicting a third modification of the opening portions of the second cladding layer according to the optical waveguide device of the embodiment.

FIG. 13 to FIG. 15 are plan views depicting modifications of the opening portions 36a of the second cladding layer 36 in FIGS. 7A to 7C mentioned above. In FIGS. 7A to 7C mentioned above, each one of the opening portions 36a of the second cladding layer 36 is communicated with one contact hole CH and is arranged to be separated each other.

As depicted in a first modification in FIG. 13, end parts of two adjacent opening portions 36a of the second cladding layer 36 in FIG. 7C may be connected each other, so that one opening portion 36b in a "U-shape" is communicated with two contact holes CH.

Moreover, like a second modification in FIG. 14, one end of each separated opening portion 36a of the second cladding layer 36 in FIG. 7C may be connected to a common opening portion arranged along the longitudinal direction, so that one continuous opening portion 36c in a comb-shaped pattern is communicated with all the contact holes CH.

Furthermore, like a third modification in FIG. 15, one lump opening portion 36d of the second cladding layer 36 may be arranged in the vicinity of two contact holes CH arranged at one end side of one core layer 34. In this case, the whole of two contact holes CH are arranged within one opening portion 36d of the second cladding layer 36, and the contact holes CH are formed only in the first cladding layer 32.

In this way, as illustrated in FIGS. 7A to 7C and FIG. 13 to FIG. 15, one opening portion of the second cladding layer 36 may be communicated with one contact hole CH or with a plurality of contact holes. That is, the opening portions of the second cladding layer 36 are communicated with the contact holes CH such that the opening portions do not interfere with the optical waveguide 30, therefore the opening portion can adopt various shapes.

The opening portions 36a of the second cladding layer 36 are communicated with the contact holes CH. By this matter, the underfill resin 50 can be filled into the contact holes CH in a state that the opening portions 36a of the second cladding layer 36 function as the flow paths.

All examples and conditional language recited herein are intended for pedagogical purpose to aid the reader in understanding the invention, and the concepts contributed by the inventor to furthering the art, and are to be construed as being without limitation to such specifically recited examples and conditions, nor does the organization of such examples in the specification relates to a showing of the superiority and inferiority of the invention. Although the embodiments of the present invention have been described, in detail, it should be understood that the various changes, substitutions, and alterations could be made hereto without departing from the spirit and scope of the invention.

Further, the clauses are disclosed about, the above embodiment hereinafter.

(Clause 1) A method of manufacturing an optical waveguide device, comprising:
preparing a wiring substrate including a connection pad on an upper race of the wiring substrate;
forming a first cladding layer on the wiring substrate;
forming a core layer on the first cladding layer;
forming a second cladding layer on the first cladding layer and the core layer, the second cladding layer having an opening portion in a region including the connection pad;
forming a contact hole at least in the first cladding layer, the contact hole being communicated with the opening portion of the second cladding layer and reaching the connection pad;
connecting a connection terminal of an optical element to the connection pad through the contact hole such that a part of the opening portion of the second cladding layer is exposed; and filling underfill resin into the contact hole through the opening portion of the second cladding layer, and sealing a lower side of the optical element.

(Clause 2) A method of manufacturing an optical waveguide device, comprising;

preparing a wiring substrate including a connection pad on an upper face of the wiring substrate;

forming a first cladding layer on the wiring substrate, the first cladding layer including a contact hole on the connection pad;

forming a core layer on the first cladding layer;

forming a second cladding layer on the first cladding layer and the core layer, the second cladding layer including an opening portion being communicated with the contact hole;

connecting a connection terminal of an optical element to the connection pad in the contact hole such that a part of the opening portion of the second cladding layer is exposed; and filling underfill resin into the contact hole through the opening portion of the second cladding layer, and sealing a lower side of the optical element.

(Clause 3) The method of manufacturing an optical waveguide device according to Clause 1, wherein, in the connecting of the optical element, a lower face of the optical element is touched to an upper face of the second cladding layer.

(Clause 4) The method of manufacturing an optical waveguide device according to Clause 1, wherein One of the opening portion of the second cladding layer is communicated with one of the contact hole, or a plurality of the contact holes.

(Clause 5) The method of manufacturing an optical waveguide device according to Clause 1, wherein the optical element is any one of a light emitting element and a light receiving element, and further comprising mounting a control element on the wiring substrate, the control element being electrically connected to the optical element.

What is claimed is:

1. An optical waveguide device, comprising:
    a wiring substrate;
    a connection pad formed in the wiring substrate;
    an optical waveguide in which a first cladding layer, a core layer, and a second cladding layer are formed on the wiring substrate in this order;
    an opening portion formed in the second cladding layer in a region including the connection pad, the opening portion penetrating from an upper face to a lower face of the second cladding layer;
    a contact hole formed at least in the first cladding layer on the connection pad, and the contact hole being communicated with the opening portion of the second cladding layer;
    an optical element, including a connection terminal, connected to the connection pad through the contact hole; and
    underfill resin filled in the opening portion of the second cladding layer and the contact hole, and the underfill resin sealing a lower side of the optical element, wherein
    a part of the opening portion of the second cladding layer protrudes outward from an outer edge of the optical element, and is exposed from the optical element.

2. The optical waveguide device according to claim 1, wherein a lower face of the optical element touches an upper face of the second cladding layer of the optical waveguide.

3. The optical waveguide device according to claim 1, wherein one of the opening portion of the second cladding layer is communicated with one of the contact hole, or a plurality of the contact holes.

4. The optical waveguide device according to claim 1, wherein
    the optical element is any one of a light emitting element and a light receiving element, and
    further comprising a control element on the wiring substrate, the control element being electrically connected to the optical element.

* * * * *